United States Patent
van Dalen et al.

(10) Patent No.: US 6,532,783 B2
(45) Date of Patent: Mar. 18, 2003

(54) CLAMPING DEVICE, TOOL AND METHOD OF MOUNTING TOOLS

(75) Inventors: Adrianus Wilhelmus van Dalen, Nijmegen (NL); Willem Adriaan de Boer, Lathum (NL)

(73) Assignee: Fico B.V. (NL)

( * ) Notice: Subject to any disclaimer, the term of this patent is extended or adjusted under 35 U.S.C. 154(b) by 0 days.

(21) Appl. No.: 09/462,681

(22) PCT Filed: Jul. 9, 1998

(86) PCT No.: PCT/NL98/00397

§ 371 (c)(1),
(2), (4) Date: Jan. 10, 2000

(87) PCT Pub. No.: WO99/03318

PCT Pub. Date: Jan. 21, 1999

(65) Prior Publication Data

US 2002/0062874 A1 May 30, 2002

(30) Foreign Application Priority Data

Jul. 11, 1997 (NL) .............................................. 1006562

(51) Int. Cl.⁷ .............................................. B21D 37/04
(52) U.S. Cl. .................. 72/15.1; 72/481.6; 140/105
(58) Field of Search ................ 72/15.1, 31.01, 72/37, 404, 481.1, 481.6, 481.7, 448; 140/105; 100/99, 918

(56) References Cited

U.S. PATENT DOCUMENTS

| | | | | |
|---|---|---|---|---|
| 2,826,947 A | * | 3/1958 | Creek | 72/448 |
| 3,269,168 A | * | 8/1966 | Anderson | 72/481.6 |
| 3,848,494 A | * | 11/1974 | Gargrave et al. | 100/918 |
| 4,550,588 A | * | 11/1985 | Abe et al. | 72/404 |
| 4,598,574 A | * | 7/1986 | Hegel et al. | 72/481.6 |
| 4,602,497 A | * | 7/1986 | Wallis | 72/481.6 |
| 4,698,894 A | * | 10/1987 | Lingaraju et al. | 100/918 |
| 5,012,664 A | * | 5/1991 | Hembree | 72/404 |
| 5,301,720 A | | 4/1994 | Plummer, Jr. et al. | |

FOREIGN PATENT DOCUMENTS

| | | | | |
|---|---|---|---|---|
| EP | 0 342 103 | * | 11/1989 | 72/481.7 |
| GB | 2262057 | | 6/1993 | |
| JP | 3-99730 | * | 4/1991 | 72/15.1 |

OTHER PUBLICATIONS

Patent Abstracts of Japan, vol. 17, No. 556 (E–1444), Oct. 6, 1993 and JP 05 159991 A, Murata Mfg. Co. Ltd., Jun. 25, 1993.

* cited by examiner

*Primary Examiner*—Lowell A. Larson
(74) *Attorney, Agent, or Firm*—Webb Ziesenheim Logsdon Orkin & Hanson, P.C.

(57) ABSTRACT

The invention relates to a device for clamping at least two tool parts movable relative to each other for processing carriers for electronic components in a press. The invention also relates to a press adapted for co-action with the clamping device. The invention also describes a tool part and a tool assembled from tool parts and adapted for co-action with the clamping device. Finally, the invention also relates to a method for mounting a tool in a press.

17 Claims, 2 Drawing Sheets

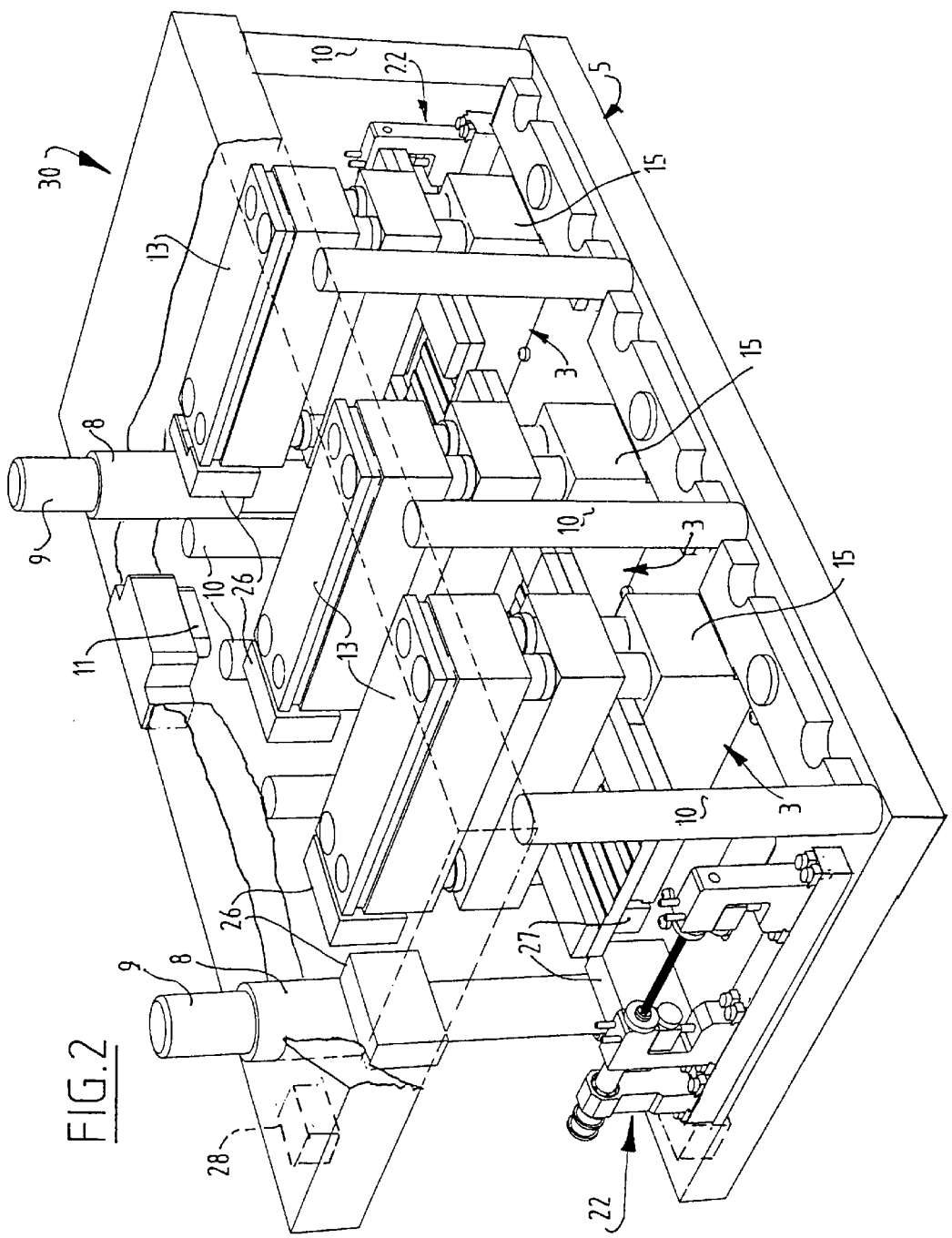

CLAMPING DEVICE, TOOL AND METHOD OF MOUNTING TOOLS

BACKGROUND OF THE INVENTION

1. Field of the Invention

The invention relates to a device for clamping at least two tool parts movable relative to each other for processing carriers for electronic components in a press. The invention also relates to a press adapted for co-action with the clamping device. The invention also relates to a tool part and a tool assembled from tool parts and adapted for co-action with the clamping device. Finally, the invention also relates to a method for mounting a tool in a press.

2. Description of the Prior Art

Processing of lead frames, such as cutting and/or deforming of lead frames, takes place for the greater part in press devices. A specific tool has to be mounted in a press device for this purpose. In order to increase the efficiency of processing of lead frames, a press is embodied so large that a plurality of tools can be placed in a single press. Depending on the desired processes and the product for processing, a module in which all required tools are accommodated is placed in such a press device. A press can thus be changed over relatively quickly. A drawback however is the limited flexibility in change-over options.

The present invention provides a clamping device, a press, tool and method for mounting a tool in a press whereby a press can be chanced over relatively quickly while a great flexibility in respect of change-over options is also obtained.

SUMMARY OF THE INVENTION

The invention provides for this purpose a device for clamping two tool parts movable relative to each other for processing carriers of electronic components in a press, comprising: two clamping members, both provided with mounting means for mounting the clamping members in mutually opposing positions on different ram parts of a press, wherein the clamping members are provided on the sides to be mutually facing with coupling means for coupling at least one tool part to each clamping member.

The clamping members are preferably provided with co-acting linear guide means. The clamping members enable change-over as required of a single tool or tool part or change-over of all tools collectively. This option is created in that a tool or tool part can be removed from the clamping members to be replaced by another tool or tool part and in that it is also possible to detach the clamping members from the press with the tools fixed thereon. In the latter case new clamping members with other tools fixed thereon can be placed in the press. A significant advantage is that the change-over to processing of different products can hereby continue to take place quickly while it has also become possible, in the case of malfunction of a single tool, to replace this separately with a new tool. Because the tool life of all tools is not necessarily the same, it is also possible to replace particular tools for preventive reasons.

Identification means are preferably arranged in at least one clamping member for identifying a tool part coupled thereto. In another preferred embodiment a transmitter is arranged in at least one clamping member for transmitting information from the clamping member to a tool part coupled thereto. Identification means can be arranged in at least one clamping member in order to prevent the wrong tools/tool parts being coupled to the clamping members. A signal can thus be generated in the case a coupling is not recognized. Another possibility is automatic coupling of the operation of the press to the identified tools connected to the clamping device. Another option is transmission of information from the clamping device to the tools coupled thereto. Data concerning for instance the use of a tool can thus be transmitted to this tool.

In another preferred embodiment at least one clamping member is provided with at least one line connection for connecting at least one line in the clamping member to at least one line in a press. A connection of at least one line thus takes place immediately through mounting of a clamping member in a press. Envisaged here is the coupling of signal lines and power lines.

When at least one clamping member is provided with identification means for identification by the press of an arranged clamping member, there results an additional monitoring option. It is also possible to automatically adapt the operation of the press to a mounted clamping member. When a writable memory is incorporated in at least one clamping member, it is possible using a transmitter to place for instance data relating to the use of a determined clamping member in the memory of this clamping member from the press. Because the history of a determined clamping member can thus be read, preventive maintenance can be planned in relatively simple manner. This also increases the possibility of searching for the cause of malfunctions.

The invention also provides a press for co-action with the described clamping device, wherein identification means are incorporated in the press for identifying the clamping member coupled thereto. The press preferably also comprises a transmitter for transmitting information from a press to a tool part coupled thereto. Using this press it is possible for instance to determine that a clamping device is mounted incorrectly. The preferred embodiment makes it possible to provide the clamping device with information relating to the operational history thereof. The advantages hereof have already been described above.

The invention also provides a tool part for processing carriers of electronic components in a press, provided with counter-coupling means for co-action with the coupling means of a clamping member as described above. A preferred embodiment of the tool part comprises a readable identification and/or a writable memory. Such a tool part can be coupled to the described clamping device. Relatively simple coupling means facilitate coupling and uncoupling of a tool part. An uncoupled tool part can be individually reconditioned, processed, stored and so on. An important advantage here is that very many assemblies of clamping device with tools are possible with a relatively limited number of tools. A limited number of tools will already provide a very wide diversity of settings. A readable identification and/or a writable memory further increases the possibilities of quality control. As already described above, the chance of incorrect settings can be limited and the history of a determined tool can be traced.

The invention also comprises a tool consisting of two co-acting tool parts as described above. The tool parts are herein preferably provided with a co-acting linear guide. A co-acting linear guide makes it possible to keep the tool parts together, also in the situation where they are uncoupled from the clamping device. This limits the chance of damage to the tools. Another advantage is that co-acting tool parts are kept physically together so that exchange of a tool part with a tool part of another tool is relatively unlikely.

The invention also provides a method for mounting a tool consisting of at least two parts for processing carriers for electronic components in a press, comprising the steps of:

a) mounting two co-acting clamping members on separate ram parts in a press, b) coupling two co-acting tool parts to separate clamping members, and c) repeating step b) until all tools for mounting have been mounted.

Through mounting of the clamping members on the ram parts of the press preferably at least one clamping member is herein identified by the press. In another preferred method, at least one tool part is identified through coupling of the tool parts to the clamping members. It will be apparent that the tool parts can also be uncoupled from the clamping members and that the clamping members can be disconnected from the press. It is not necessary to progress through the steps in the sequence a,b,c. It is likewise possible to couple the clamping members to tool parts and to subsequently mount the clamping members in a press. A processing sequence b,c,a hereby results. Another option is that, as the occasion arises, the clamping members remain mounted in the press and only tool parts are uncoupled/coupled. A method thus results with the steps b,c. The large number of possibilities illustrates the flexibility with which tools can be mounted in a press using this method. The most desirable methods can be chosen depending on the situation.

BRIEF DESCRIPTION OF THE DRAWINGS

The present invention will be further elucidated with reference to the non-limitative embodiments shown in the following figures. Herein:

FIG. 2 shows a cut-away, perspective view of an assembly of clamping device with three tools.

DETAILED DESCRIPTION OF THE PREFERRED EMBODIMENTS

Figure 1:
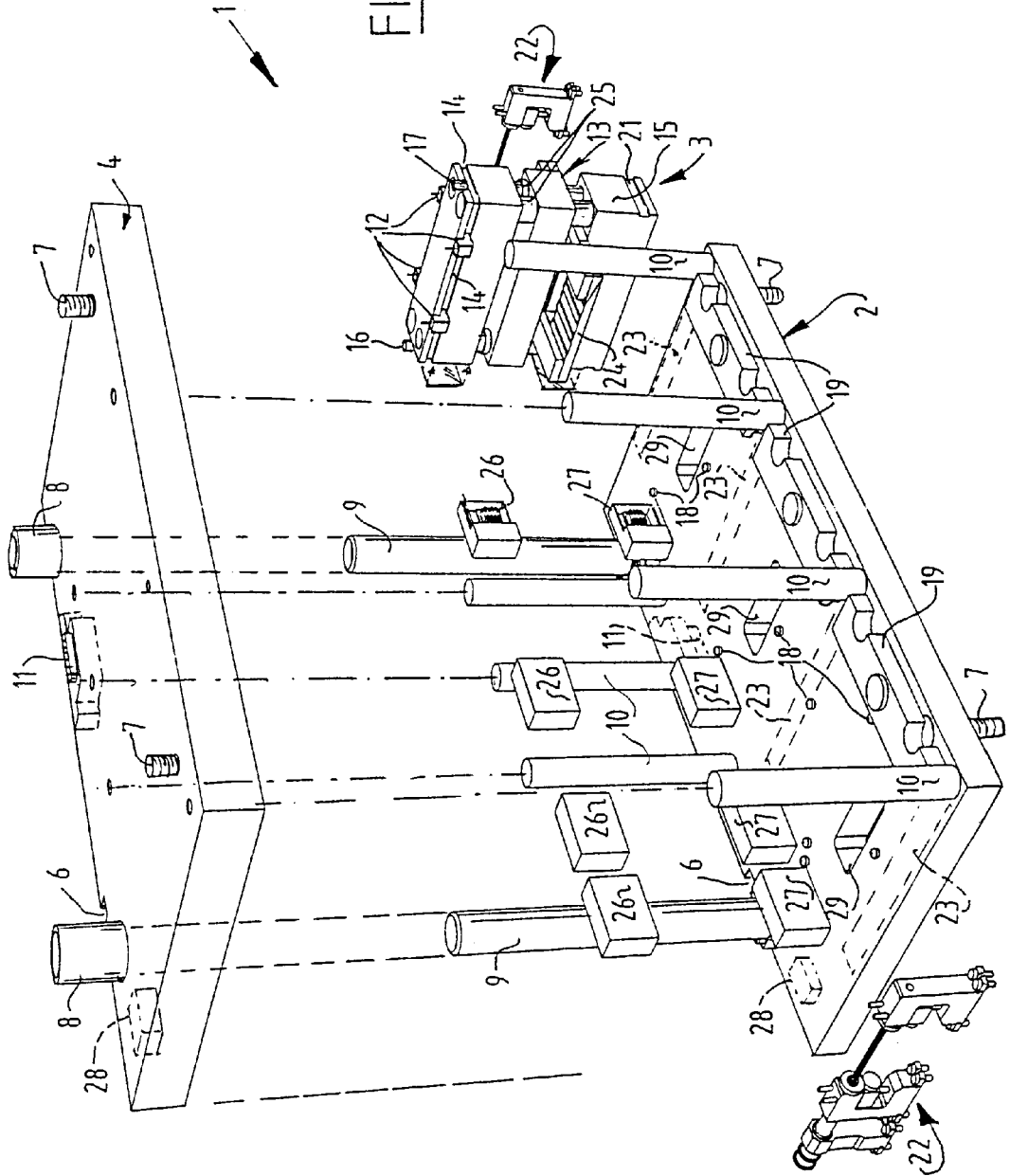
FIG. 1 shows a perspective view of an exploded situation of clamping device and tool.

FIG. 1 shows an exploded assembly 1 of clamping device 2 and tool 3 for mounting in a press (not shown). Clamping device 2 comprises two plate-like clamping members 4,5 which can be fixed by means of key ways 6 and bolts 7 to the ram parts of a press. Received in the upper clamping member 4 are sleeves 8 through which guide rods 9 mounted on clamping member 5 can move reciprocally. Sleeves 8 and guide rods 9 form linear guide means with which clamping members 4,5 are mutually connected. The lower clamping member 5 is provided with stoppers 10 with which the minimum mutual distance between clamping members 4,5 is determined. Placed in clamping members 4,5 are plugs 11 for co-action with sockets (not shown) in the press device. When clamping members 4,5 are mounted in a press, power lines and signal lines arranged in clamping members 4,5 can be connected directly to lines in the press using the plugs 11.

On the upper clamping member 4 are fixed suspending elements 12 which are shown detached in this figure but which in reality are situated on the underside of clamping member 4. These suspending elements 12 are arranged for fixing of an upper tool part 13 in which grooves 14 are arranged. For locking of upper tool part 13 after it has been pushed into suspending elements 12 until it comes to lie against a stop 16, a locking pin 17 can be placed into clamping member 4. Placed on lower clamping member 5 are dowel pins 18 between which a lower tool part 15 can be placed. For this purpose a fixing strip 19 must be removed from clamping member 5. Fixing strip 19 is provided with an edge 20 for co-action with a groove 21 in the lower tool part 15. On the side of the lower tool part 15 remote from groove 21 a split groove (not shown) can be arranged for co-action with a key (not shown) forming part of clamping member 5.

For transport of the lead frames for processing are shown roller conveyors 22, four of which can for instance be mounted on clamping member 5 at the position of the rectangular parts 23 shown using broken lines. Tool 3 is provided with a lead frame guide 24 which is located at the same height as the transport height of the roller conveyors 22 during transport of the lead frames.

The upper tool part 13 is connected to the lower tool part 15 via linear guide means 25. These latter determine the positioning of tool parts 13,15 in relation to each other. The upper tool part 13 is therefore suspended in suspending elements 12 with a limited clearance. For identification of a tool 3 coupled to clamping device 2 the clamping members 4,5 are provided with respective reading units 26,27 with which a code of tool 3 can be read. Particularly advantageous for this purpose is the use of EEPROMs built into tool parts 13,15. An EEPROM can not only be used to read an identification but is also a programmable data carrier. Using reading units 26,27 information concerning the use of a tool 3 can thus be written to the EEPROMs. Clamping device 2 can also be provided with EEPROMs 28 whereby a press can recognize the clamping members 4,5 and provide clamping device 2 with historical data relating to its use.

Recesses 29 are arranged in clamping member 5 for passage of possible material remnants resulting from processing of the lead frames.

FIG. 2 shows an assembly 30 of clamping members 4,5 with three tools 3 mounted therein. The shown assembly 30 greatly resembles the assembly 1 shown in FIG. 1. Corresponding components therefore have the same numerals. The most important difference is that assembly 30 is shown in assembled form with three tools 3. At variance with the situation described with reference to FIG. 1, only two roller conveyors 22 are placed in assembly 30 instead of the four roller conveyors 22 as described with reference to FIG. 1.

Clearly visible in this figure is that reading units 26,27, which are also provided with transmitters, lie against the upper tool parts 13 and lower tool parts 15. Information transfer is thus possible.

What is claimed is:

1. Device for clamping two tool parts movable relative to each other for processing carriers of electronic components in a press, comprsing:

an upper clamping member and a lower clamping member, both provided with mounting means for mounting the clamping members in mutually opposing positions on different ram parts of a press, wherein the clamping members are provided on the sides to be mutually facing with coupling means for coupling at least one tool part to each clamping member; wherein the upper clamping member includes at least one suspending element for coaction with a corresponding groove on a first tool part, wherein the lower clamping member includes at least one fixing strip having an edge for coaction with a corresponding groove on a second tool part; and wherein the lower clamping member includes a plurality of dowel pins for providing position stop locations for positioning the second tool part on the lower clamping member.

2. Clamping device as claimed in claim 1, wherein the clamping members are provided with co-acting linear guide means.

3. Clamping device as claimed in claim 1, wherein identification means are arranged in at least one clamping member for identifying a tool part coupled thereto.

4. Clamping device as claimed in claim 1, wherein a transmitter is arranged in at least one clamping member for transmitting information from the clamping member to a tool part coupled thereto.

5. Clamping device as claimed in claim 1, wherein at least one clamping member is provided with at least one line connection for connecting at least one line in the clamping member to at least one line in a press.

6. Clamping device as claimed in claim 1, wherein at least one clamping member is provided with identification means for identification by the press of a coupled clamping member.

7. Clamping device as claimed in claim 1, wherein a writable memory is incorporated in at least one clamping member.

8. Press for co-action with a clamping device as claimed in claim 1, wherein identification means are incorporated in the press for identifying a clamping member coupled thereto.

9. Press for co-action with a clamping device as claimed in claim 1, wherein the press comprises a transmitter for transmitting information from the press to a tool part coupled thereto.

10. Tool part for processing carriers of electronic components in a press, provided with counter-coupling means for co-action with the coupling means of a clamping member as claimed in claim 1.

11. Tool part as claimed in claim 10, wherein the tool part comprises a readable identification.

12. Tool part as claimed in claim 10, wherein the tool part comprises a writable memory.

13. Tool consisting of two co-acting tool parts as claimed in claim 10.

14. Tool as claimed in claim 13, wherein the tool parts are provided with a co-acting linear guide.

15. Method for mounting a tool consisting of at least two parts for processing carriers for electronic components in a press, comprising the steps of:

a) mounting an upper clamping member and a lower clamping member on separate ram parts in a press, b) a first coacting tool part to the upper clamping member via at least one suspending element coacting with a corresponding groove on the first tool part and a second coacting tool part to the lower clamping member via at least one fixing strip having an edge coacting with a corresponding groove on the second tool part; wherein the lower clamping member includes a plurality of dowel pins for providing position stop locations for positioning the second tool part on the lower clamping member, and c) repeating step b) until all tools for mounting have been mounted.

16. Method as claimed in claim 15, wherein through mounting of the clamping members on the ram parts of the press at least one clamping member is identified by the press.

17. Method as claimed in claim 15, wherein at least one tool part is identified through coupling of the tool parts to the clamping members.

\* \* \* \* \*